US008900911B2

(12) United States Patent
Hasin et al.

(10) Patent No.: US 8,900,911 B2
(45) Date of Patent: Dec. 2, 2014

(54) FRAME HOLDER

(71) Applicant: Essence Solar Solutions Ltd., Herzlia Pituach (IL)

(72) Inventors: Slava Hasin, Petach-Tikva (IL); Ron Helfan, Tel-Aviv (IL)

(73) Assignee: Essence Solar Solutions Ltd., Herzlia Pituach (IL)

( * ) Notice: Subject to any disclaimer, the term of this patent is extended or adjusted under 35 U.S.C. 154(b) by 0 days.

(21) Appl. No.: 13/904,205

(22) Filed: May 29, 2013

(65) Prior Publication Data
US 2013/0320376 A1 Dec. 5, 2013

Related U.S. Application Data

(60) Provisional application No. 61/652,332, filed on May 29, 2012.

(51) Int. Cl.
| *H01L 21/00* | (2006.01) |
| *B32B 7/12* | (2006.01) |
| *H01L 31/18* | (2006.01) |
| *H05K 13/04* | (2006.01) |
| *H01L 31/0232* | (2014.01) |
| *H01L 21/683* | (2006.01) |
| *H01L 33/58* | (2010.01) |
| *H01L 31/052* | (2014.01) |
| *B32B 3/06* | (2006.01) |

(52) U.S. Cl.
CPC .............. *H01L 31/052* (2013.01); *Y02E 10/52* (2013.01); *B32B 7/12* (2013.01); *H01L 31/18* (2013.01); *H05K 13/0465* (2013.01); *H01L 31/0232* (2013.01); *H01L 21/683* (2013.01); *H01L 33/58* (2013.01); *B32B 3/06* (2013.01)
USPC ................... 438/69; 438/27; 438/65; 257/98; 257/432

(58) Field of Classification Search
CPC ... H01L 31/052; H01L 31/18; H01L 31/0232; H01L 21/683; H01L 31/048; B32B 3/06; G02B 7/026; Y02E 10/52
USPC .................................. 438/27, 65; 257/98, 432
See application file for complete search history.

(56) References Cited

U.S. PATENT DOCUMENTS

| 3,574,333 A * | 4/1971 | Ohara ........................... 215/295 |
| 5,053,850 A | 10/1991 | Baker et al. |

(Continued)

FOREIGN PATENT DOCUMENTS

| WO | WO 03/036689 | 5/2003 |
| WO | WO 2009/144715 | 12/2009 |

(Continued)

OTHER PUBLICATIONS

International Search Report and the Written Opinion Dated Oct. 1, 2013 From the International Searching Authority Re. Application No. PCT/IL2013/050458.

(Continued)

*Primary Examiner* — Reema Patel
*Assistant Examiner* — Syed Gheyas

(57) ABSTRACT

A method of assembling an optical element on top of an active component in a substrate, by providing a substrate with active component and an optical element with a base and lateral base walls, fixating a bottom surface of a frame holder with opening and lateral frame walls arranged in a polygonal structure to the substrate so that the opening is positioned over the active component, and mounting the optical element in the opening so the lateral frame walls apply lateral confining mechanical force on the lateral base walls.

30 Claims, 7 Drawing Sheets

(56) References Cited

U.S. PATENT DOCUMENTS

| | | | |
|---|---|---|---|
| 5,357,060 A | 10/1994 | Yamashita | |
| 5,453,581 A | 9/1995 | Liebman et al. | |
| 5,498,297 A * | 3/1996 | O'Neill et al. | 136/246 |
| 5,872,399 A | 2/1999 | Lee | |
| 6,115,262 A | 9/2000 | Brunner et al. | |
| 6,147,410 A | 11/2000 | Elliott et al. | |
| 6,201,305 B1 | 3/2001 | Darveaux et al. | |
| 6,316,736 B1 | 11/2001 | Jairazbhoy et al. | |
| 6,853,091 B2 | 2/2005 | Miyajima | |
| 6,921,018 B2 | 7/2005 | Ference et al. | |
| 6,969,808 B2 | 11/2005 | Shiraki | |
| 7,005,750 B2 | 2/2006 | Liu | |
| 7,042,098 B2 | 5/2006 | Harun et al. | |
| 7,064,449 B2 | 6/2006 | Lin et al. | |
| 7,115,819 B1 | 10/2006 | Rumsey | |
| 7,224,073 B2 | 5/2007 | Kim | |
| 7,276,793 B2 | 10/2007 | Sakamoto et al. | |
| 7,658,071 B1 * | 2/2010 | McDermott | 60/641.8 |
| 7,723,855 B2 | 5/2010 | Tsai et al. | |
| 7,911,056 B2 | 3/2011 | Liu et al. | |
| 7,972,875 B2 | 7/2011 | Rogers et al. | |
| 8,026,440 B1 | 9/2011 | Gordon | |
| 8,093,492 B2 | 1/2012 | Hering et al. | |
| 8,128,852 B2 * | 3/2012 | Shin et al. | 264/225 |
| 8,242,350 B2 | 8/2012 | Cashion et al. | |
| 8,261,660 B2 | 9/2012 | Menard | |
| 8,377,358 B2 * | 2/2013 | Keenihan et al. | 264/275 |
| 2003/0067264 A1 | 4/2003 | Takekuma | |
| 2005/0275079 A1 * | 12/2005 | Stark | 257/680 |
| 2008/0190478 A1 | 8/2008 | Lin | |
| 2008/0316724 A1 | 12/2008 | Huang | |
| 2009/0101207 A1 * | 4/2009 | Milbourne et al. | 136/259 |
| 2009/0114265 A1 | 5/2009 | Milbourne et al. | |
| 2010/0012171 A1 | 1/2010 | Ammar | |
| 2010/0163105 A1 * | 7/2010 | Chuang et al. | 136/256 |
| 2010/0236603 A1 | 9/2010 | Menard et al. | |
| 2010/0326494 A1 | 12/2010 | Okamoto | |
| 2011/0108092 A1 * | 5/2011 | Le Lievre et al. | 136/246 |
| 2012/0115262 A1 | 5/2012 | Menard et al. | |
| 2012/0313241 A1 | 12/2012 | Bower | |
| 2012/0314388 A1 | 12/2012 | Bower et al. | |
| 2013/0112239 A1 * | 5/2013 | Liptac et al. | 136/246 |
| 2013/0319507 A1 | 12/2013 | Hasin et al. | |
| 2013/0323526 A1 | 12/2013 | Hasin et al. | |

FOREIGN PATENT DOCUMENTS

| | | |
|---|---|---|
| WO | WO 2010/091391 | 8/2010 |
| WO | WO 2011/005486 | 1/2011 |
| WO | WO 2013/179286 | 12/2013 |
| WO | WO 2013/179287 | 12/2013 |
| WO | WO 2013/179288 | 12/2013 |

OTHER PUBLICATIONS

International Search Report and the Written Opinion Dated Oct. 2, 2013 From the International Searching Authority Re. Application No. PCT/IL2013/050460.

Restriction Official Action Dated Dec. 23, 2013 From the U.S. Appl. No. 13/904,221.

Invitation to Pay Additional Fees Dated Jul. 31, 2013 From the International Searching Authority Re. Application No. PCT/IL2013/050459.

Azur Space "Enhanced Fresnel Assembly—EFA. Cell Type: Concentrator Triple Junction Solar Cell—3C40A. Application: Concentrating Photovoltaic COC Assembly. Board Size: 19,6 x 18,0 mm", Azur Space Solar Power GmbH, 4 P., 2010.

Azur Space "Enhanced Fresnel Assembly—EFA. Cell Type: Concentrator Triple Junction Solar Cell—3C40A. Application: Concentrating Photovoltaic COC Assembly. Board Size: 32,0 x 37,0 mm", Azur Space Solar Power GmbH, 4 P., 2010.

Longford et al. "Smart Packages for CPV Cell Devices", Global Solar Technology, 3(5): May 10-12, 2010.

Maxwell "Surface Mount Zero Defect Design Check List", AVX Corporation, Technical Information, 8 P., Feb. 18, 2011.

Suncore "CTJ Receiver Assembly—5.5 mm x 5.5 mm", Datasheet, Suncore Photovoltaic Technology Co. Ltd., 1 P., Sep. 2012.

Telecontrolli "A New Phototvoltaic Receiver With Highest Performance and Multiplication Factor", Telecontrolli and System Design R&D, 1 P., 2012.

International Search Report and the Written Opinion Dated Oct. 8, 2013 From the International Searching Authority Re. Application No. PCT/IL2013/050459.

Official Action Dated May 8, 2014 From the U.S. Appl. No. 13/904,221.

Official Action Dated Sep. 15, 2014 From the U.S. Patent and Trademark Office Re. U.S. Appl. No. 13/904,221.

\* cited by examiner

FRAME HOLDER

RELATED APPLICATIONS

This application claims the benefit of priority under 35 USC §119(e) of U.S. Provisional Patent Application No. 61/652,332 filed May 29, 2012, the contents of which are incorporated herein by reference in their entirety.

This application is also related to co-filed, co-pending and co-assigned U.S. patent application Ser. No. 13/904,251and PCT Patent Applications No. PCT/IL2013/050459, entitled "PHOTOVOLTAIC MODULE ASSEMBLY" by Slava Hasin and Ron Helfan, the disclosures of which are incorporated herein by reference.

This application is also related to co-filed, co-pending and co-assigned U.S. patent application Ser. No. 13/904.221and PCT Patent Application No. PCT/IL2013/050460, entitled "SELF ALIGNING SOLDERING" by Slava Hasin and Ron Helfan, the disclosures of which are incorporated herein by reference.

FIELD AND BACKGROUND OF THE INVENTION

The present invention, in some embodiments thereof, relates to assembly of active unit arrangements and, more particularly, but not exclusively, to assembly active unit arrangements using optical element holders.

Concentrated photovoltaic (CPV) technology uses optical elements such as lenses to concentrate sunlight onto a smaller area of active components such as solar cells. Optical elements are held on top of solar cells by holders made for this purpose.

During the last years various holders of optical elements for the solar industry have been developed. For example, vase-shaped and tube-shaped holders for a round ball lens.

Existing holders are attached by elements such as screws or fasteners. Also, alignment is required between the solar cell, the lens (or secondary optical element—SOE), and a primary lens. This is frequently done after assembly of the solar cell by active optical alignment where light is projected through the optical element to be aligned and readings are taken from the solar cell in order to validate the said alignment and positioning. This method is expensive and requires custom machinery and tooling per each design.

SUMMARY OF THE INVENTION

According to an aspect of some embodiments of the present invention there is provided.

According to an aspect of some embodiments of the present invention there is provided a method of assembling an optical element on top of an active component in a substrate, the method comprising: providing a substrate having an active component; providing an optical element having a base with a plurality of lateral base walls; fixating a bottom surface of a frame holder having an opening and a plurality of lateral frame walls arranged in a polygonal structure to the substrate so that the opening is positioned over the active component, and mounting the optical element in the opening so that the plurality of lateral frame walls apply lateral confining mechanical force on the plurality of lateral base walls.

Optionally, the fixating is performed by soldering.

Optionally, the fixating is performed by bonding using an adhesive.

Optionally, the base is polygonal.

Optionally, the lateral frame walls are of different dimensions and bend angles.

Optionally, the active component is a photovoltaic cell.

Optionally, the active component is a light emitting diode.

Optionally, the mounting performed using pick and place technology.

Optionally, the frame holder is manufactured by way of producing an initial shape from a metal sheet and bending or pressing the shape to form the plurality of lateral frame walls.

Optionally, thickness of the plurality of lateral frame walls is within a range of 100 to 500 micron.

Optionally, coefficient of thermal expansion (CTE) of the frame holder material is approximately between about 4 parts per million (ppm)/° C. and about 9 parts per million (ppm)/° C.

Optionally, coefficient of thermal expansion (CTE) of the frame holder material is about 24 parts per million (ppm)/° C.

Optionally, coefficient of thermal expansion (CTE) of the frame holder material is about more than 80 parts per million (ppm)/° C. and the optical element is made of silicone.

Optionally, the frame holder is plated to fit soldering processes.

Optionally, the bottom surface of frame holder is soldered to the substrate by way of reflow process.

Optionally, the frame holder is assembled by at least one of regular surface mount technology and microelectronic assembly process.

Optionally, the frame holder is designed as a standard surface-mount technology (SMT) component.

Optionally, wire bonding of the active component is performed after the fixation of the frame holder.

Optionally, the frame holder is sized and shaped to cover the active component and the wire bonding.

Optionally, an angle of each of the plurality of lateral frame walls from the base is controlled during production in order to fit a draft angle at a respective base wall from the plurality of lateral base walls.

More optionally, each the plurality of frame wall has different angle so as to apply selective force upon each base wall of the optical element.

Optionally, the frame holder is soldered onto a substrate and a solder fillet is created between the substrate solder pad and the frame holder wall, thus permanently retaining the angle of the wall and the location of the lens.

More optionally, the fillet can be controlled to define the flexibility of the lateral frame wall.

More optionally, creation of the fillet is selective so that for some of the frame walls a fillet is created and for others no fillet is created.

Optionally, the plurality of lateral base walls of the optical element is attached to the inner surfaces of the plurality of frame walls by adhesion material.

Optionally, the plurality of lateral base walls of the optical element is attached to the inner surfaces of the plurality of frame walls by a snap fit mechanism.

Optionally, the plurality of frame holder walls are fabricated with protrusions to maintain a controlled and repetitive space between them and the plurality of base walls.

Optionally, the lateral frame walls include fixtures which serve as exhaust channels enabling voidless encapsulation of the active component.

Optionally, the optical element is manufactured by over-molding onto the frame holder which defines the location and structure of the optical element.

Optionally, encapsulation is over-molded onto the frame holder which defines the location and structure of the over molding.

Optionally, the frame holder is bonded to the optical element to become one SMT component.

Optionally, elasticity of the frame walls allow accurate positioning of optical elements having an variance in outline dimensions due to manufacturing tolerances.

Optionally, an enclosed environment created between the optical element and the active component is filled with encapsulation agent.

According to an aspect of some embodiments of the present invention there is provided a method of assembling a plurality of optical elements on top of a plurality of active component in a board, wherein for each one of the plurality of active components, an optical element is assembled by any one of the methods above.

According to an aspect of some embodiments of the present invention there is provided a system, comprising: a substrate having an active component; an optical element having a base with a plurality of lateral base walls; a frame holder having a bottom surface, an opening and a plurality of lateral frame walls arranged in a polygonal structure; wherein the frame holder is fixated to the substrate so that the opening is positioned over the active component; and wherein the optical element is mounted in the opening so that the plurality of lateral frame walls apply lateral confining mechanical force on the plurality of lateral base walls.

According to an aspect of some embodiments of the present invention there is provided a frame holder for assembling an optical element to an active component, comprising: a bottom surface comprising a aperture of dimensions greater then dimensions of the active component; a plurality of frame walls substantially perpendicular to the bottom surface and arranged to form a polygonal structure encircling the aperture; wherein the elasticity coefficient of at least one of the plurality of frame walls is sufficient to maintain the optical element by the frame holder by lateral confining mechanical force applied on the optical element.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF EMBODIMENTS OF THE INVENTION

Figure 1A:
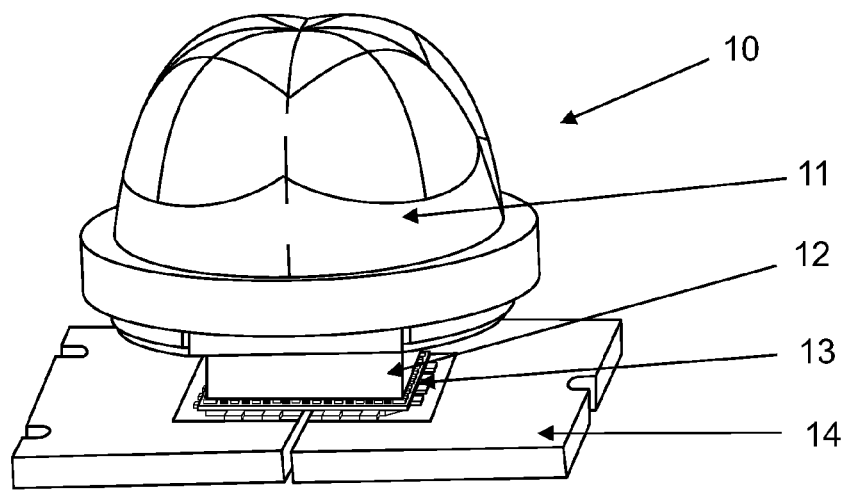
FIG. 1A schematically illustrates an optically active unit, according to some embodiments of the present invention.

The present invention, in some embodiments thereof, relates to assembly of optically active unit and, more particularly, but not exclusively, to assembly of optically active unit using optical element holders.

According to some embodiments of the present invention, an optically active unit contains an active component, an optical element and a substrate wherein assembly methods of the active unit include the use of a holder for the optical element and specifically a frame-shaped holder with lateral frame walls. The optical element is held mechanically by the frame walls and also positioned accurately and maintains position by the frame.

According to some embodiments of the present invention there are provided a frame holder for holding an optical element, such as a lens, on top of an active component such as, but not limited to, a semiconductor, an optical sensor, light emitting diode (LED) and solar cell.

According to some embodiments of the present invention, the optical element has a polygonal base with lateral base walls.

Optionally, the frame holder walls have partial elasticity that allows mechanically supporting the optical element on top of the active component. In such embodiments lateral confining mechanical force is applied by the frame walls on the base walls of the optical element. Optionally, the optical element in inserted to the frame and bonded vertically using adhesive. Optionally the optical element is deposited with an encapsulation material before the bonding or encapsulation process and bonding is done at the same process with at least one encapsulation and/or bonding material.

The frame is soldered onto a board, for example, a printed circuit board (PCB), having the active component, by a process and/or machinery used regularly in the assembly of electronic and/or microelectronic circuits for example, pick and place (P&P) technology, die attachment and/or surface-mount technology (SMT). Soldering the frame as part of regular electronic soldering reduces costs while providing equal or higher accuracy.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 1B:
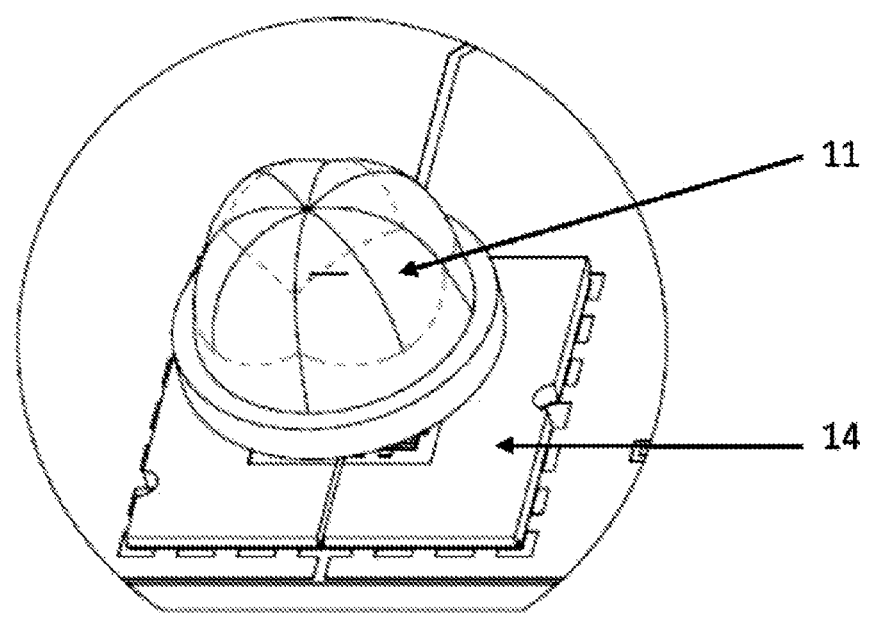
FIG. 1B schematically illustrates another view of an optically active unit, according to some embodiments of the present invention.

Reference is now made to FIGS. 1A and 1B, which show different views of an optically active unit 10 which includes a substrate 13 and a frame holder 12 that is placed to support and align an optical element 11 on top of the active component placed on the substrate inside frame holder 12, according to some embodiments of the present invention. The optically active unit 10 is mounted on heat spreaders 14. As used herein, the active component may be, for example, an optical sensor, photovoltaic cell, LED or other semiconductor, according to some embodiments of the present invention. As used herein, the optical element may be, for example, lens, prism, polarizer or diffractor.

Figure 2A:
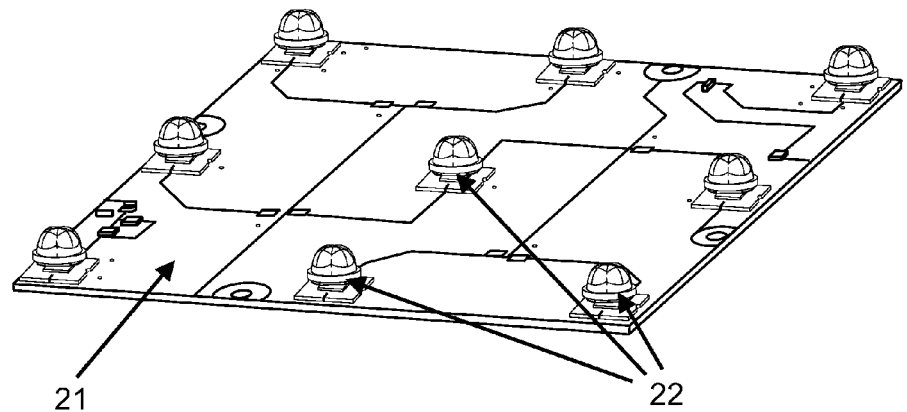
FIG. 2A schematically illustrates a backplane supporting a plurality of optically active units, according to some embodiments of the present invention.
Figure 2B:
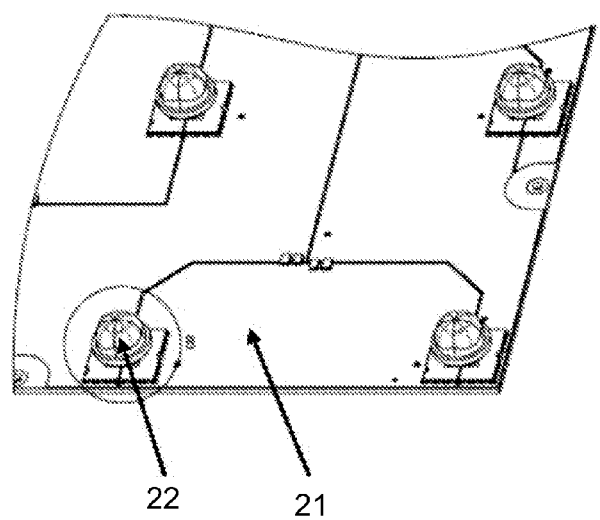
FIG. 2B schematically illustrates a segment the backplane illustrated in FIG. 2A, according to some embodiments of the present invention.

Reference is also made to FIGS. 2A and 2B, which are respectively a view of a backplane 21 supporting a plurality of optically active units 22 and a segment of that backplane where each optically active unit 22 is defined as depicted in FIG. 1, as mentioned in related applications, according to some embodiments of the present invention. As used herein, the backplane may be any substrate, for example an electronic component support, for instance a PCB. Optionally, active component and/or frame holder are soldered directly to backplane.

Figure 3A:
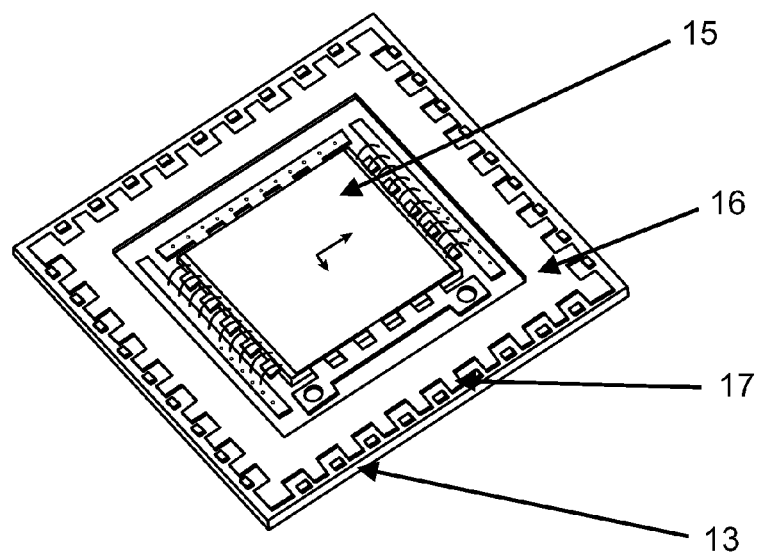
FIG. 3A schematically illustrates a substrate with an active component prepared for soldering of a frame holder, according to some embodiments of the present invention.
Figure 3B:
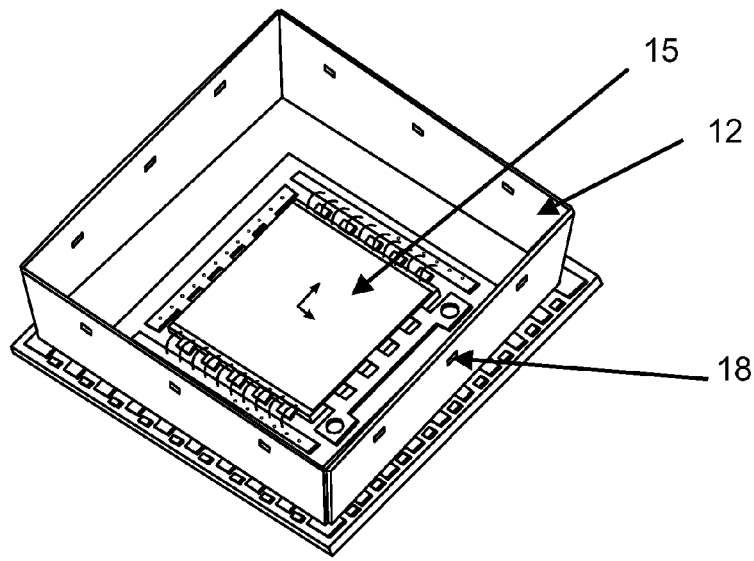
FIG. 3B schematically illustrates a substrate with an active component and a frame holder, according to some embodiments of the present invention.

Reference is also made to FIG. 3A and FIG. 3B which illustrate exemplary optically active unit in the process of assembly, according to some embodiments of the present invention. FIG. 3A shows substrate 13 with active component 15. Electroplated on the substrate are soldering pads 16 with tooth 17. FIG. 3B further shows a frame holder 12 soldered on substrate 13.

Optionally, frame holder 12 contains a polygonal bottom surface, for example a square, with a centered aperture of dimensions optionally greater then dimensions of active component 15 and a plurality of external frame walls arranged to form a polygonal structure and perpendicular to the bottom surface. Draft angle between frame bottom surface and walls is determined by manufacturing capabilities. An exemplary angle is 5 degrees.

Optionally, each lateral frame wall can have a different angle so as to apply selective force upon each base wall. Optionally, heights of frame walls are aligned with one another and selected so that an optical element mounted on the frame holder is aligned by walls heights. In such a manner, the optical element is accurately placed so light is concentrated directly on the active component. This optical element alignment requires less processing than a process of aligning an optical element base that is set to support the bottom of the optical element.

Optionally, the lateral frame walls are not equal or symmetrical and are of different dimensions and bend angles.

Optionally, optical element is aligned by the optical element base, according to manufacturing accuracy of the optical element.

The height of frame walls or the base of the optical element, determines the distance between the active component and the exit aperture of the optical element, according to some embodiments of the present invention. This distance should be equal to the optical focal length of the optical element. An exemplary such distance is 0.325 millimeters.

Optionally, gaps between frame walls are as thin as could be obtained in the manufacturing process, so an enclosed environment is created to protect the active component.

Optionally, the enclosed environment is filled with an encapsulation material and therefore makes the active component environmentally sealed.

Optionally, the lateral frame walls include fixtures which serve as exhaust channels enabling voidless encapsulation of the active component.

Optionally, frame holder 12 is also used as a basin for the deposition, molding and/or dispensing of an encapsulation material. Optionally, frame holder 12 helps applying accurate dosage and doping of the encapsulation material.

Optionally, protrusions 18 are made on the inner side of frame walls to provide a gap between base walls of optical element and frame walls, so the gap could be filled with adhesion material. This is especially important when base of optical element is slightly bigger than frame walls, so when mounted there would otherwise be no controlled gap for the adhesive. For example, 3 protrusions of 50 microns deep are made for each frame wall, as shown in FIG. 3B.

Optionally, frame holder 12 is made of concentrated sun resistant materials stable at highly intense ultraviolet (UV) radiation and high temperature such as between 70 and 500 Celsius. Substance should endure concentrated sunlight of solar concentration at range from ×500 to ×1500 suns (1 sun is an irradiance measurement unit which equals 1,000 Watt to Square Meter) and very high heat densities of 40-150 Watts to square centimeter, for extended use of 20 years as required by solar industry standards, such as IEC 62108.

Optionally, linear coefficient of thermal expansion (CTE) of the material is approximately 8-9 to comply with both glass and ceramic thermal expansions, to avoid tension between frame holder and optical element or between frame holder and substrate, and possible cracks and/or breakage. An exemplary material for use in some embodiments of the present invention is a nickel iron alloy whose coefficient closely minors soft glass, for example Alloy42 (42% Nickel and 58% Ferrum). Other possible materials include, but not limited to, metals, silicones, glass and/or ceramics.

According to some embodiments of the present invention, the structure of frame holder 12 allows for flexibility of the frame walls for holding base of optical element 11. This should also be considered when material is chosen. Flexibility of frame walls allows the frame holder to maintain the optical component along all manufacturing tolerances of the optical component (+/−0.1 millimeters), almost without influence on assembly accuracy and without compromising on the distance between optical element and active component.

Optionally, wall thickness is within a range of 100 to 150 micron, to allow flexibility but also structural integrity and stiffness. According to some embodiments of the present invention, frame holder is square, as shown at FIG. 1. However, other polygonal or oval arrangements of walls are possible to support respective bases of optical element.

Optionally, area ratio between substrate 13 and the active component 15 is between 1:1 and 1:6. For example, for an active component with a size of 5.5 millimeter×5.5 millimeter the ratio can be approx 1:5, for an active component with a size of 10 millimeter×10 millimeter the ratio can be approximately 1:2.89.

Figure 4A:
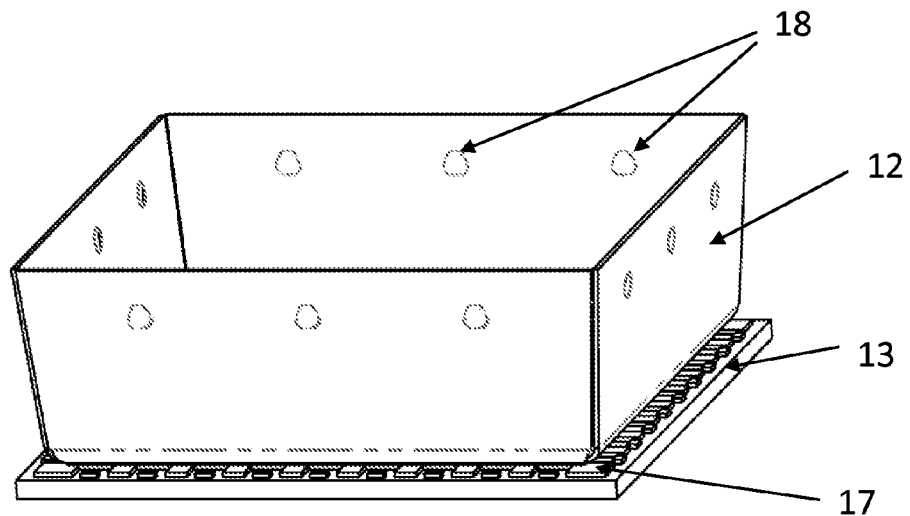
FIG. 4A a side view of the optically active unit parts illustrated in FIG. 3B, according to some embodiments of the present invention.
Figure 4B:
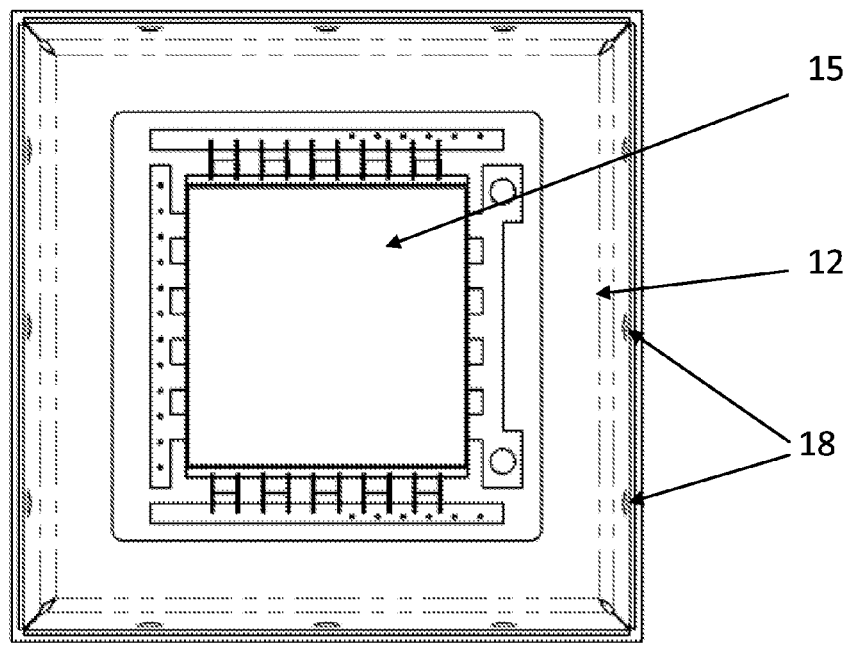
FIG. 4B a top view of the optically active unit parts illustrated in FIG. 3B, according to some embodiments of the present invention.

Reference is also made to FIG. 4A and FIG. 4B which show the optically active unit of FIG. 3B in different views, according to some embodiments of the present invention. FIG. 4A shows a side view of the optically active unit and FIG. 4B shows a top view of the optically active unit.

Figure 5:
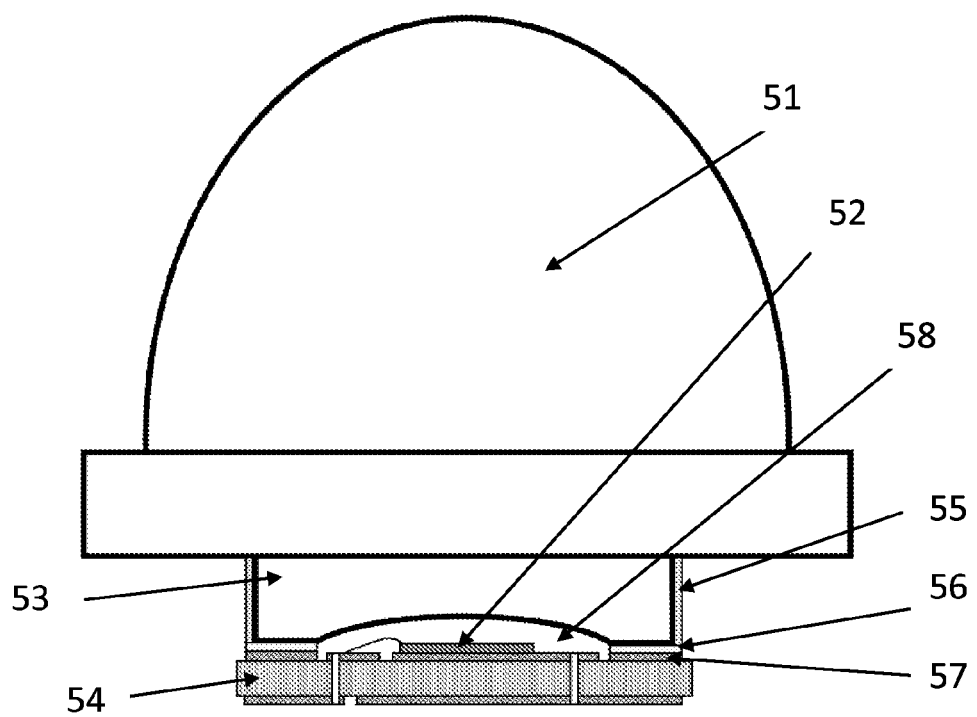
FIG. 5 is a cross section schematically illustrates an optically active unit, according to some embodiments of the present invention.

Reference is also made to FIG. 5 which illustrates a cross section of an optically active unit, which includes a substrate 54 with active component 52 and a frame holder, wherein bottom surface 56 of frame holder is attached to substrate 54 by soldering pads 57 and lateral walls 55 of frame holder holds base 53 of optical element 51, according to some embodiments of the present invention. Optionally, encapsulation material 58 fills the space between optical element 51 and active component 52, such as silicone, for example, gels silicones or silicone elastomers.

Figure 6:
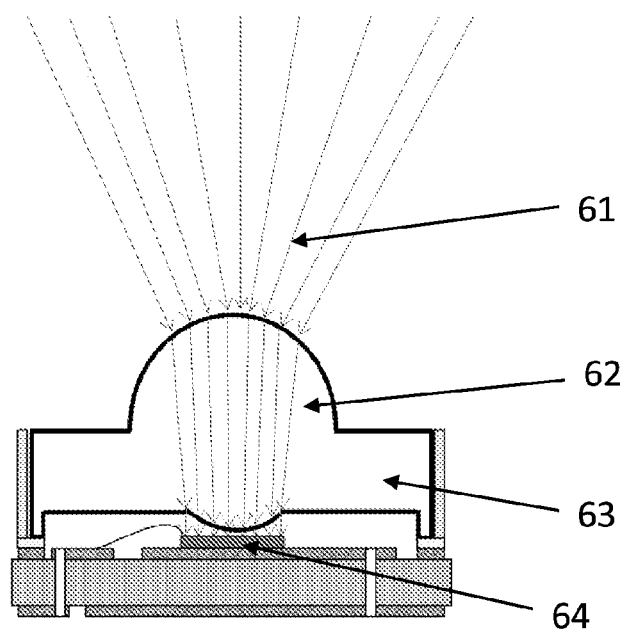
FIG. 6 is a cross section schematically illustrates an optically active unit, according to other embodiments of the present invention.

Reference is also made to FIG. 6 which illustrates a cross section of an optically active unit, wherein base 63 of 62 is built around the round part of the optical element, according to some embodiments of the present invention. Also illustrated are light rays 61 concentrated by optical element 62 to hit active component 64. For example, in CPV, the optical element concentrates and homogenizes the light, after the light was concentrated from a larger area by a primary concentrator element, thus allowing the use of a small active component while still utilizing most of the light available.

Figure 7A:
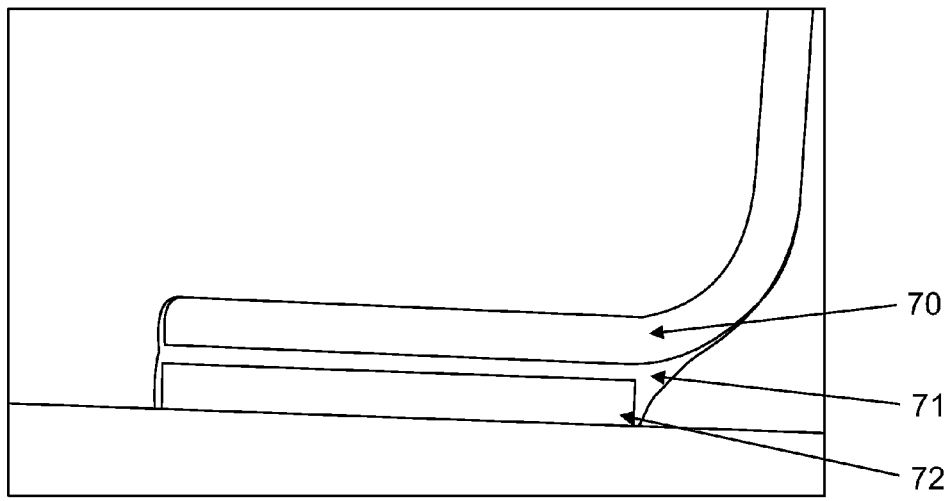
FIG. 7A is a cross section schematically illustrates solder fillet between a frame holder and a soldering pad in an area without a tooth, according to some embodiments of the present invention.
Figure 7B:
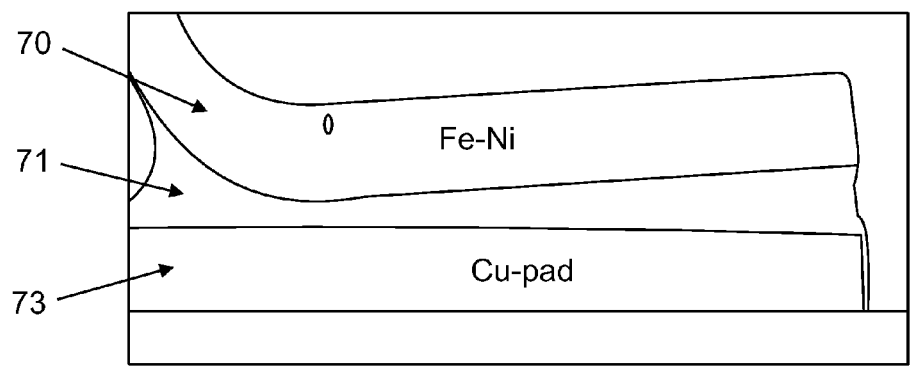
FIG. 7B is a cross section schematically illustrates solder fillet between a frame holder and a soldering pad in an area with a tooth, according to some embodiments of the present invention.

Reference is also made to FIG. 7A and FIG. 7B which illustrates a cross section of solder fillet 71 between a frame holder 70 and a soldering pad 72 and 73. In FIG. 7A, the cross section is made in an area without a tooth, so soldering pad 72 is the size of the frame base and the edge of the pad is located below the bending of the frame walls. In FIG. 7B, the cross section is made in an area with a tooth, so soldering pad 73 is bigger than the frame base and the tooth continues beyond the bending of the frame walls.

Figure 8:
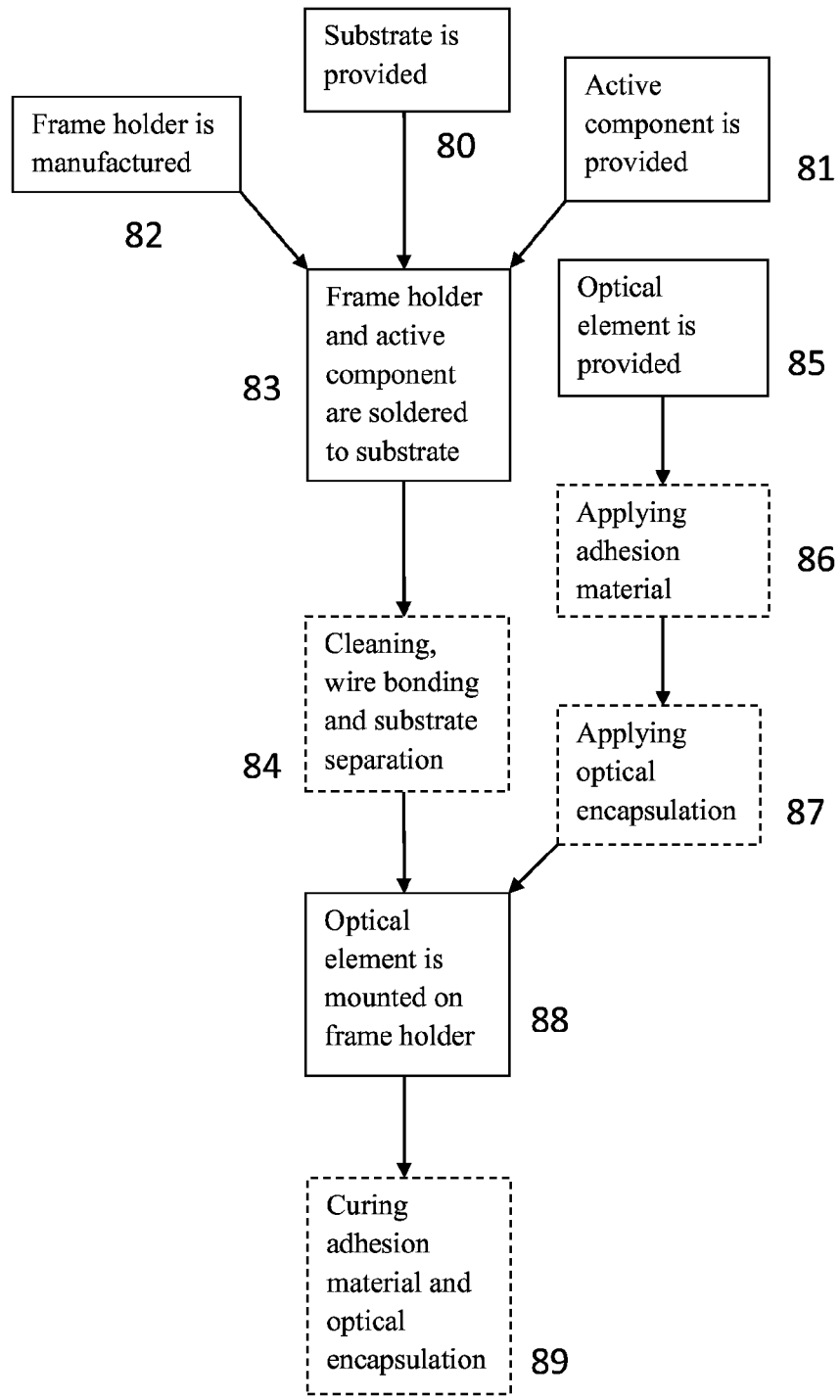
FIG. 8 is a flowchart schematically representing a method for assembling an optically active unit, according to some embodiments of the present invention.

Reference is now also made to FIG. 8, which is a flowchart of a process of assembling an optically active unit, for example as depicted in FIG. 1, by using a frame holder for laterally supporting an optical element on top of an active component, for example a photovoltaic cell, LED, semiconductor or an optical sensor, according to some embodiments of the present invention.

First, as shown at 80, a substrate 13 is provided, for example, a PCB such as FR4 glass epoxy, metal-core printed circuit boards (MCPCB), Ceramic, Glass or Silicon, according to some embodiments of the present invention.

Optionally substrate 13 is provided with soldering pads 16 for soldering process of frame holder 12 and active component 15, as shown at FIG. 3A, according to some embodiments of the present invention.

Optionally, design of soldering pads 16 matches the size and shape of the bottom surface of frame holder 12 and consists of teeth 13 for excessive solder paste spreading, thus preventing tilting and rotating of frame holder 12 during soldering process, for example as described in related application entitled "Self aligning soldering".

As shown at 81, active component is provided.

Also, as shown at 82, frame holder 15 is manufactured. Possible manufacturing techniques include, but not limited to, punching an initial shape from a metal sheet and bending to form lateral frame walls, punching an initial and pressing to form lateral frame walls, using die casting, create the frame shape by laser cutting and then pressing to form lateral frame walls, milling, extrusion and/or etching, as is suitable for the chosen material, according to some embodiments of the present invention.

Optionally, surface of frame holder is also prepared with soldering pads for soldering process and to allow more accurate placement. Optionally, only the bottom surface of frame holder is prepared with soldering pads. Optionally, soldering pads of the frame and soldering pads of the substrate are identical in dimensions, within manufacturing tolerances.

Optionally, frame holder is plated with coatings to fit soldering processes. An exemplary plating for use in the some embodiments of the present invention is electrolytic Nickel layer (3 microns-5 microns) and electrolytic Au layer (max 0.3 microns). Optionally a Copper layer (2-30 microns) can also be applied underneath the Nickel in order to reduce Ferrum diffusion through Nickel layer and therefore improve solder joint reliability.

Then, as shown at 83 frame holder 12 and active component 15 are optionally assembled by Die Attachment processes and machinery used regularly in the making of microelectronic and/or electronic circuits or in components assembly, including P&P processes which are focused on wafer level assembly, according to some embodiments of the present invention.

Optionally, frame holder 12 is soldered by reflow soldering. Other soldering processes are possible, for example, air reflow, nitrogen reflow, vacuum reflow, vapor phase reflow, vacuum vapor phase reflow, or eutectic reflow, if eutectic alloys are used as solders.

As mentioned, solder fillets are created between soldering pads on the substrate and the frame walls, in the bending radius area of the frame walls, as shown in FIG. 7A and FIG. 7B according to some embodiments of the present invention. The fillets are permanently retaining the angle of the wall and thus the location of the optical component. Also, the fillets significantly improve the strength of the frame near the bending area, so the frame more flexible further from bending area.

Optionally, creation of fillets is selective so that a fillet is created for only some of the frame walls.

Optionally, active component 15 and frame holder 12 are soldered at the same iteration. Optionally, active component 15 and frame holder 12 are soldered in separate phases. In this case double reflow process is needed for the optically active unit, according to some embodiments of the present invention. Optionally, the optically active unit is also assembled on spreader 14, so tertiary reflow process should is needed.

Optionally, the frame holder is the only mechanical bonding element and/or aligning element that is used for attaching said optical element to substrate. In such embodiments, the cost of manufacturing is reduced as mechanical bonding elements such as fasteners or screws are not used and therefore the assembly process is simplified.

Also, using this bonding method increases the accuracy of the placement of the frame holder and may eliminate a requirement for an additional alignment before and/or during the placement of the frame holder onto the substrate, such as optical or active alignment. In such a manner, manufacturing costs are reduced further. The assembly tolerance is below 0.1 millimeters due to the pads and self alignment technique, for example as described in related application entitled "Self aligning soldering".

Optionally, as shown at 84, cleaning process is applied any residues left from soldering process.

Optionally, as shown at 84, wire bonding process is applied.

Optionally, a plurality of active components and frame holders are soldered one substrate, for example, 32 units. In this case separation of the substrate to single units is necessary before optical units are mounted, as shown at 84, according to some embodiments of the present invention. All forces used in separation are applied directly on the frame holder and not on the active component. The separation process would be highly difficult without the protection given by the frame holder to the active component and wire bonding.

Then, as shown at 85, optical element is provided. Base 53 of optical element, according to some embodiments of the present invention, is constructed to fit accurately inside walls 55 of frame holder, as shown at FIG. 5. For example, base 51 is shaped as a square of side length fitting the length of frame walls 55, with lateral walls.

Optionally, optical element is manufactured so that draft angle of base 53 is equivalent to the angle between frame bottom 56 surface and frame walls 55, so base 53 better fits inside frame holder walls.

Optionally, frame holder acts as a mold or basin for the molding of the optical component, such as a silicon dome lens used in LED.

Optionally, as shown at 86, the optical element is attached to the inner surfaces of the frame holder walls by adhesion material. Optical element is thus bonded to the frame holder by vertical bonding, more resistant to shear stress than horizontal bonding. Optionally, adhesion material is filled in all possible gaps between frame walls and lens walls created by protrusions 18, thus creating very good bonding interfaces.

Optionally, base walls of the optical element are attached to frame holder wall by snap fit mechanism.

Optionally, silicone elastomer is used as adhesion material as it endures high UV intensity and high temperature. However, other adhesion materials are possible, such as epoxy based materials.

Optionally, as shown at 87, optical element is applied with optical encapsulation agent 22. also increasing protection for active component.

Optionally, adhesion material and encapsulation are applied at the same stage with at least one encapsulation and/or bonding material.

Then, as shown at 88, the base of the optical element 51 is mounted on frame holder by inserting the optical element 51 inside walls 55 of frame holder, as shown at FIG. 5, according to some embodiments of the present invention. Walls 55 of frame holder apply lateral confining mechanical force on optical element 51 which is then held mechanically by the flexibility of walls 55, placing the optical element 51 accurately with tolerance of up to 100 micron. Usually, tolerance of 50 micron can be achieved, according to some embodiments of the present invention.

According to some embodiments of the present invention, mounting of optical element is performed by P&P technology, thus simplifying the process and reducing costs. Optionally and additionally, this stage may also be performed manually without the requirement of additional tooling and jigs which assist in the placing of the optics into an accurate location.

Optionally, attachment of optical element 51 and frame holder is done by holding the optical component in an upside down direction and assembling the substrate with active component and frame holder, held by P&P from the bottom part, onto the optical component. During substrates P&P, the substrates can be located in trays which are suitable for machines and sit on frame holders without damaging the active components and wire bonding. In any other configuration the unit cannot be assembled automatically without rotating the substrate, which require custom machines and make the process complicated.

According to some embodiments of the present invention, a plurality of optically active units 22 is mounted on a board 21, as shown in FIG. 2. Optionally, active component and frame holder are soldered directly on said board, wherein said board is a substrate such as PCB.

The enclosure created between optical element and active component serves as protective environment for said active component. During the process of assembly, said optical element is restrained by the walls of frame holder and cannot touch said active component and harm it as well as other sensitive elements such as wire bonding. Also, during use, the enclosed environment protects said active component and other elements from any outside harm. Additionally, the frame protects the active component and other elements during handling so that foreign objects cannot come in touch with the active component if, for example, the optically active unit drops out of a tray, an employee accidently touches the unit or a machinery element, such a P&P arm, comes in touch with the unit by error.

According to other embodiments of the present invention, the frame holder act as a mold or basin for the dispensing of sol gel compounds, wherein the frame and compound are inserted to a sintering oven together, optical element is mounted on frame holder and only then soldered onto a substrate with an active component.

Optionally, as shown at 89, curing is performed for adhesion material and optical encapsulation.

It is expected that during the life of a patent maturing from this application many relevant frame holders for optical components will be developed and the scope of the term frame holder is intended to include all such new technologies a priori. As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of assembling an optical element on top of an active component in a substrate, said method comprising:
    providing a substrate having an active component;
    providing an optical element having a base with a plurality of lateral base walls;
    fixating a bottom surface of a frame holder to said substrate, wherein said frame holder has an opening and a plurality of lateral frame walls arranged around the boundary of said opening, wherein said plurality of lateral frame walls are separated by gaps allowing each of said plurality of lateral frame walls to move independently and wherein said opening is positioned over said active component, and
    mounting said base in said opening so that said plurality of lateral frame walls apply a plurality of lateral retaining mechanical forces on said plurality of lateral base walls;
    wherein elasticity of each of said plurality of frame walls allows accurate positioning of said optical element having an variance in outline dimensions due to manufacturing tolerances by applying said plurality of lateral retaining mechanical forces.

2. The method of claim 1, wherein said fixating is performed by a soldering process.

3. The method of claim 1, wherein said fixating is performed by bonding using an adhesive material.

4. The method of claim 1, wherein said base is polygonal corresponding a polygonal arrangement around said opening of said plurality of lateral frame walls.

5. The method of claim 1, wherein said lateral frame walls separated by gaps are of different dimensions and bend angles to independently adjust each of said plurality of lateral retaining mechanical forces in order to correctly positioning said optical element over said active component.

6. The method of claim 1, wherein said active component is a photovoltaic cell and said optical element is a concentrating lens.

7. The method of claim 1, wherein said active component is a member of a group consisting of a light emitting diode, a semiconductor, an optical sensor, solar cell wherein said optical element is an optical waveguide.

8. The method of claim 1, wherein said mounting is Performed using a pick and place device.

9. The method of claim 1, wherein said frame holder is manufactured by way of producing an initial shape from a metal sheet and bending or pressing said shape to form said plurality of lateral frame walls.

10. The method of claim 1, wherein thickness of said plurality of lateral frame walls is within a range of 100 to 500 micron.

11. The method of claim 2, wherein said frame holder is plated to fit soldering processes.

12. The method of claim 2, wherein said bottom surface of said frame holder is soldered to said substrate by way of reflow process.

13. The method of claim 1, wherein said frame holder is assembled by at least one of regular surface mount technology and microelectronic assembly process.

14. The method of claim 1, wherein said frame holder is designed as a surface mount technology (SMT) component.

15. The method of claim 1, wherein a wire bonding of said active component is performed after said fixating of said frame holder.

16. The method of claim 1, wherein said frame holder is sized and shaped to position said optical element over said active component and an associated wire bonding as a cover to protect said active component and said associated wire bonding.

17. The method of claim 1, wherein an angle of each of said plurality of lateral frame walls from said base is controlled during production in order to fit a draft angle at a respective base wall from said plurality of lateral base walls.

18. The method of claim 17, wherein each of said plurality of lateral frame wall has a different angle so as to apply a selective force upon each base wall of said optical element.

19. The method of claim 1, wherein said frame holder is soldered onto a substrate and a solder fillet is created between the substrate solder pad and the frame holder wall, thus permanently retaining the angle of the wall and the location of the lens.

20. The method of claim 19, wherein said fillet can be controlled to define the flexibility of the said lateral frame wall.

21. The method of claim 19, wherein creation of said fillet is selective so that for some of said frame walls a fillet is created and for others no fillet is created.

22. The method of claim 1, wherein said optical element is secured to said frame holder adhesive material between said plurality of lateral base walls of said optical element to said plurality of frame walls of said frame holder.

23. The method of claim 1, wherein said optical element is secured to said frame holder by a snap fit mechanism having a lock in position fixing the said elasticity of said plurality of lateral frame walls and said plurality of lateral cconfining mechanical forces.

24. The method of claim 1, wherein said plurality of lateral frame walls are fabricated with protrusions to maintain a controlled and repetitive space between them and said plurality of base walls.

25. The method of claim 1, wherein said lateral frame walls include fixtures which serve as exhaust channels enabling voidless encapsulation of said active component.

26. The method of claim 1, wherein said optical element is manufactured by over-molding onto said frame holder which defines the location and structure of said optical element.

27. The method of claim 1, wherein encapsulation is over-molded onto said frame holder which defines the location and structure of said over molding.

28. The method of claim 1, wherein said frame holder is bonded to said optical element to become one SMT component.

29. The method of claim 1, wherein an enclosed environment created between said optical element and said active component is filled with encapsulation agent.

30. A frame holder for assembling an optical element over an active component, comprising:
- a bottom surface comprising an aperture of dimensions greater than dimensions of said active component; and
- a plurality of lateral frame walls separated by gaps allowing each of said plurality of lateral frame walls to move independently, wherein said plurality of lateral frame walls are substantially perpendicular to said bottom surface and wherein said plurality of lateral frame walls are arranged surrounding said aperture;
- wherein elasticity of at least one of said plurality of lateral frame walls is sufficient for said frame holder to retain said optical element by a plurality of lateral retainig mechanical forces applied on said optical element by said plurality of lateral frame walls.

* * * * *